(12) United States Patent
Yamashita

(10) Patent No.: US 11,631,965 B2
(45) Date of Patent: Apr. 18, 2023

(54) LIGHT EMITTING DEVICE AND OPTICAL PART

(71) Applicant: NICHIA CORPORATION, Anan (JP)

(72) Inventor: Toshiaki Yamashita, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 86 days.

(21) Appl. No.: 17/222,548

(22) Filed: Apr. 5, 2021

(65) Prior Publication Data

US 2021/0313767 A1 Oct. 7, 2021

(30) Foreign Application Priority Data

Apr. 6, 2020 (JP) .............................. JP2020-068007

(51) Int. Cl.

| | |
|---|---|
| *H01S 5/068* | (2006.01) |
| *H01S 5/06* | (2006.01) |
| *H01S 5/22* | (2006.01) |
| *H01S 5/024* | (2006.01) |
| *H01S 5/00* | (2006.01) |

(52) U.S. Cl.
CPC .......... *H01S 5/0611* (2013.01); *H01S 5/0087* (2021.01); *H01S 5/02476* (2013.01); *H01S 5/06825* (2013.01); *H01S 5/2214* (2013.01)

(58) Field of Classification Search
CPC ... H01S 5/0611; H01S 5/06825; H01S 5/0087
See application file for complete search history.

(56) References Cited

U.S. PATENT DOCUMENTS

| | | | |
|---|---|---|---|
| 2013/0236755 A1* | 9/2013 | Goldberg | ............ H01M 10/484 429/90 |
| 2015/0085262 A1 | 3/2015 | Ogura | |
| 2015/0372200 A1 | 12/2015 | Seko et al. | |
| 2018/0119897 A1 | 5/2018 | Vogt et al. | |
| 2019/0199052 A1 | 6/2019 | Miyoshi et al. | |
| 2019/0305512 A1* | 10/2019 | Kitajima | ............... H01S 5/0425 |

FOREIGN PATENT DOCUMENTS

| | | |
|---|---|---|
| EP | 3 138 732 A1 | 3/2017 |
| JP | H07-055741 A | 3/1995 |
| JP | 2001-243560 A | 9/2001 |
| JP | 2015-060159 A | 3/2015 |
| JP | 2016-009693 A | 1/2016 |
| JP | 2016-122715 A | 7/2016 |
| JP | 2017-043138 A | 3/2017 |
| JP | 2018-528576 A | 9/2018 |
| JP | 2019-117827 A | 7/2019 |
| JP | 2019-125654 A | 7/2019 |
| JP | 2019-175903 A | 10/2019 |
| JP | 2020-080400 A | 5/2020 |
| WO | WO-2019/131439 A1 | 7/2019 |

* cited by examiner

*Primary Examiner* — Michael Carter
(74) *Attorney, Agent, or Firm* — Foley & Lardner LLP

(57) ABSTRACT

A light emitting device includes: a light emitting element; and a wavelength conversion member including: a wavelength conversion part configured to convert light emitted from the light emitting element into light having a different wavelength and to output the light having the different wavelength, an enclosing part enclosing the wavelength conversion part, and a conducting layer disposed on the enclosing part and surrounding the wavelength conversion part. The conducting layer comprises ruthenium oxide.

19 Claims, 8 Drawing Sheets

LIGHT EMITTING DEVICE AND OPTICAL PART

CROSS-REFERENCE TO RELATED APPLICATION

This application claims priority to Japanese Patent Application No. 2020-068007, filed on Apr. 6, 2020, the disclosure of which is hereby incorporated by reference in its entirety.

BACKGROUND

The present disclosure relates to a light emitting device and an optical part.

Laser light is utilized in various applications. The use of laser light may require safety considerations. Japanese Patent Publication No. 2019-117827 discloses an optical part equipped with a conversion member capable of converting the wavelength of laser light, which is excitation light, into light having a different wavelength, and a conducting fine wire for the purpose of detecting a breakage or the like of a conversion member.

SUMMARY

One of the objects of the present disclosure is to provide a light emitting device and an optical part having high detection accuracy.

According to one embodiment, a light emitting device comprises a light emitting element and a wavelength conversion member. The wavelength conversion member includes a wavelength conversion part, an enclosing part, and a conducting layer. The wavelength conversion part is configured to convert light emitted from the light emitting element into light having a different wavelength and to output the light having the different wavelength. The enclosing part encloses the wavelength conversion part. The conducting layer is disposed on the enclosing part, and surrounds the wavelength conversion part. The conducting layer is formed by using ruthenium oxide.

According to another embodiment, an optical part comprises a base and a conducting layer. The base has a wavelength conversion part and an enclosing part. The wavelength conversion part is configured to outputs light having a different wavelength from a wavelength of light incident on the base. The enclosing part encloses lateral faces of the wavelength conversion part. The conducting layer is disposed on an upper face or a lower face of the enclosing part, and surrounds the wavelength conversion part. The conducting layer includes using ruthenium oxide.

According to certain embodiments of the present disclosure, a light emitting device and an optical part having high detection accuracy can be provided.

DETAILED DESCRIPTION

Figure 1:
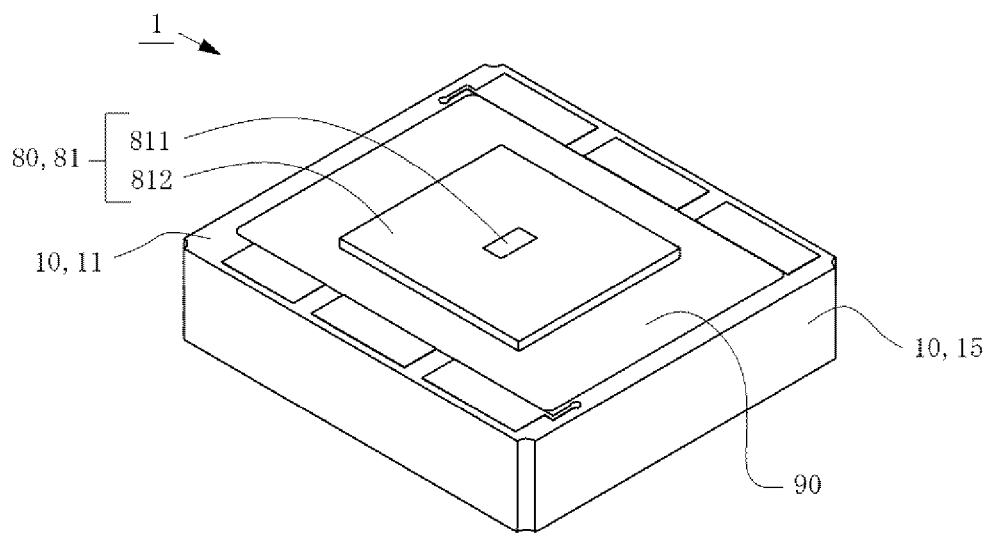
FIG. 1 is a perspective view of a light emitting device according to one embodiment.

In the present application, a polygon, such as a triangle, square, or the like, should be interpreted to encompass a polygon subjected to processing, such as cutting angles, beveling, chamfering, rounding, or the like. The location of such processing is not limited to a corner (an end of a side). A polygon should similarly be interpreted to encompass a polygon subjected to processing in the middle of a side. In other words, any polygon-based shape subjected to processing should be included in the interpretation of a "polygon" in the description and accompanying claims.

This similarly applies to any word describing a specific shape, such as a trapezoidal, circular, recessed, or projected shape, without being limited to a polygon. The above definitions also apply to sides forming such polygons. In other words, even if a corner or middle of a side is subjected to processing, the term "side" should be interpreted to include the processed portion. To distinguish a "polygon" or "side" that is intentionally not processed from a shape subjected to processing, the shape will be described by adding the phrase "strict-sense," such as "a strict-sense square."

Furthermore, in the description or the scope of claims, expressions describing a position, such as upper and lower, left and right, surface and back, front and behind, near front and inner, or the like, merely describe the relative positional, orientational, or directional relationship between or among certain parts, and does not necessarily coincide with the relationship of the parts in use. For example, even in the case in which a part is installed in a finished product such that the upper face of the part is positioned as a lateral face of the finished product, the upper face of the part remains the upper face for that part.

Moreover, in the description and the scope of claims herein, when there are plurality of pieces of a certain constituent element and a distinction must be made, a word such as "first," "second," or the like might be added. The manner in which such a word is used in the description might not match the manner in which such a word is used in the claims if the subject to be distinguished or the perspective for such a distinction differs.

For example, in the case in which there are elements that are distinguished by the words, "first," "second," and "third," in the description, and only the "first" and "third" elements are recited in a certain claim, they might be distinguished by the words, "first" and "second," in the claim for readability. In such a case, the elements accompanied by the words, "first" and "second," in the claim would refer to the subjects accompanied by the words, "first" and third" in the description.

Certain embodiments of the present disclosure will be explained below with reference to the accompanying drawings. The embodiments described below are provided to give shape to the technical ideas of the present invention, and are not intended to limit the present invention. In the explanation below, the same designations and reference numerals denote the same or similar members, for which a redundant explanation will be omitted as appropriate. The sizes of and relative positions of the members shown in the drawings might be exaggerated for clarity of explanation.

Figure 2:
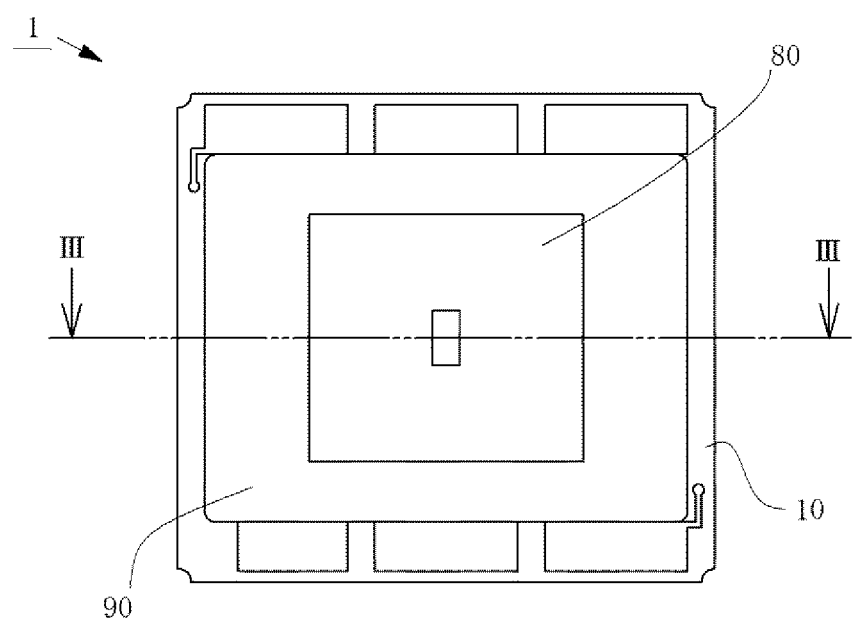
FIG. 2 is a top view corresponding to FIG. 1.
Figure 3:
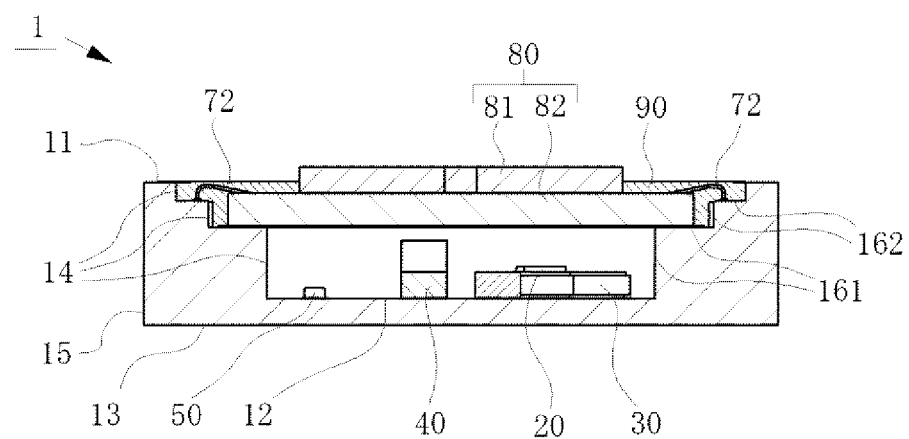
FIG. 3 is a cross-sectional view of the light emitting device taken along line in FIG. 2.
Figure 4:
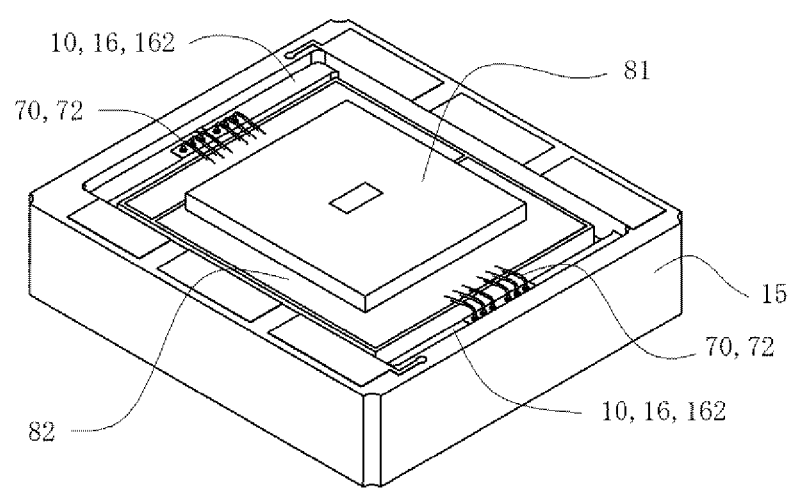
FIG. 4 is a perspective view explaining the internal structure of the light emitting device according to the embodiment.
Figure 5:
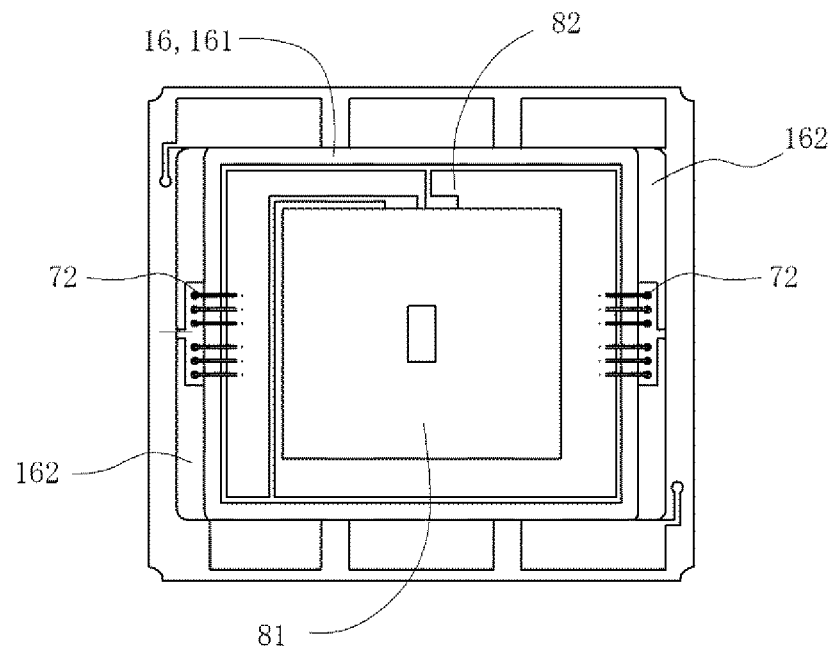
FIG. 5 is a top view corresponding to FIG. 4.
Figure 6:
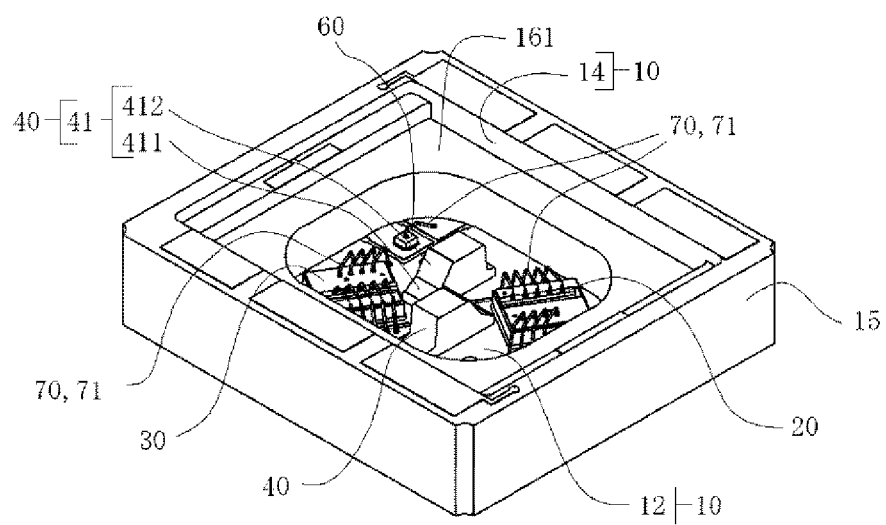
FIG. 6 is a perspective view explaining the internal structure of the light emitting device according to the embodiment.
Figure 7:
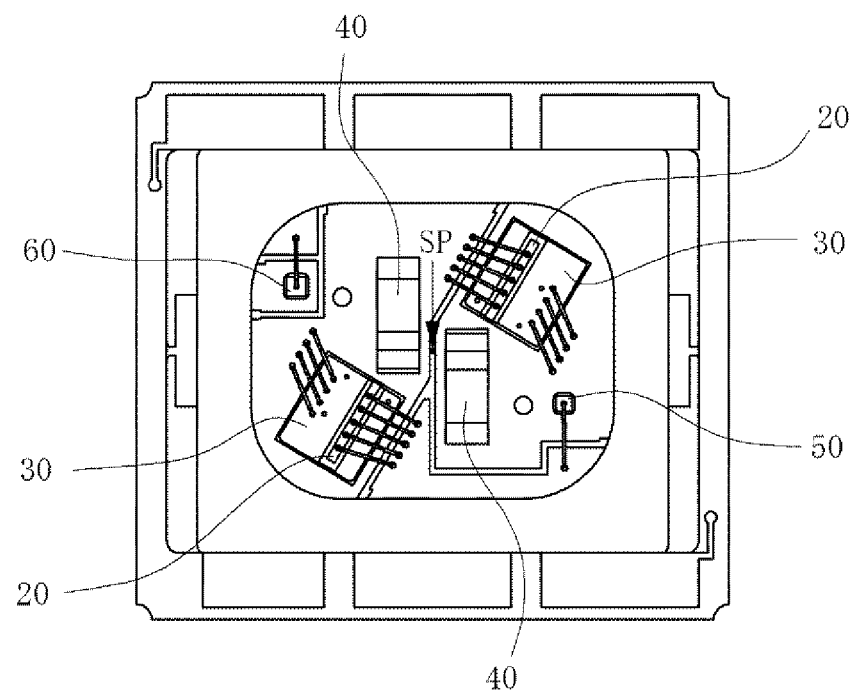
FIG. 7 is a top view corresponding to FIG. 6.
Figure 8:
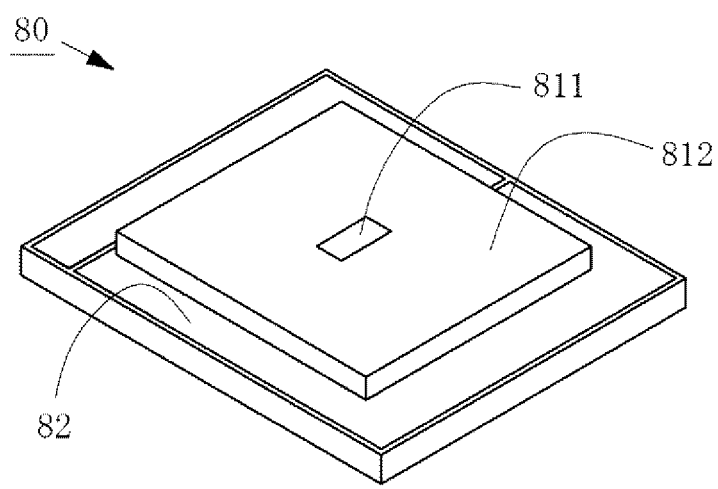
FIG. 8 is a perspective view of an optical part according to the embodiment.
Figure 9:
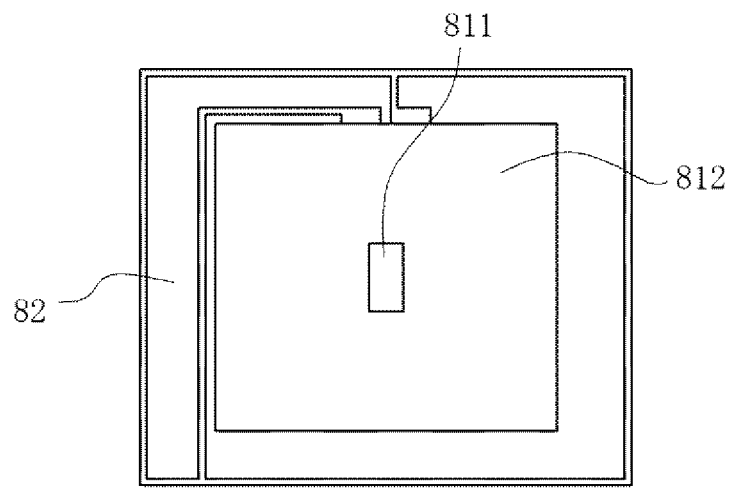
FIG. 9 is a top view corresponding to FIG. 8.
Figure 10:
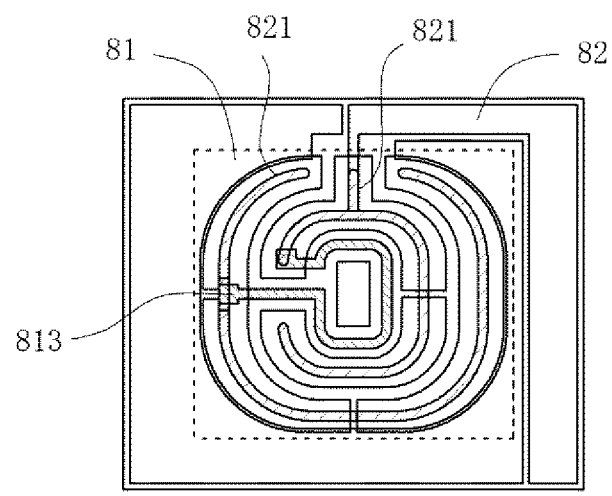
FIG. 10 is a top view seen through the base of the wavelength conversion member to explain the bonding face between the light transmissive member and the wavelength conversion member according to the embodiment.
Figure 11:
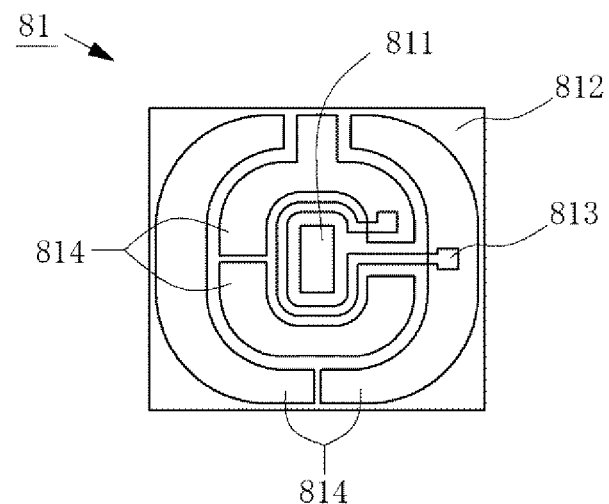
FIG. 11 is a bottom view of the wavelength conversion member according to the embodiment.
Figure 12:
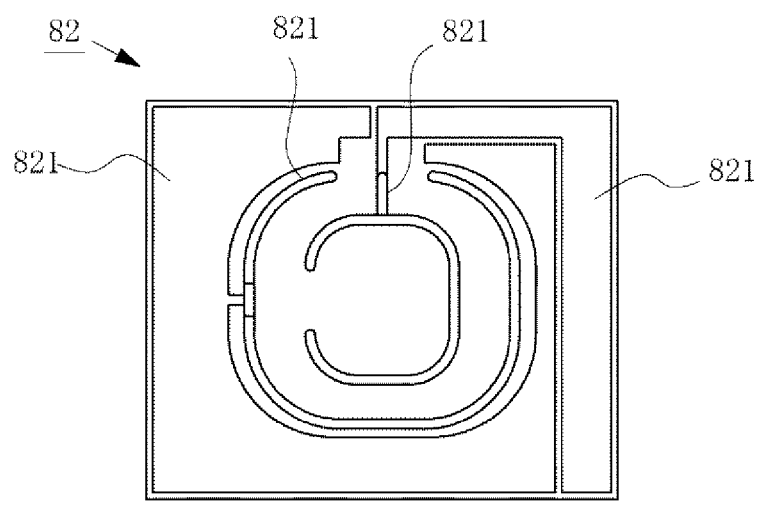
FIG. 12 is a top view of the light transmissive member according to the embodiment.

FIG. 1 is a perspective view illustrating a light emitting device 1 according to one embodiment. FIG. 2 is a top view of the light emitting device 1. FIG. 3 is a cross-sectional view of the light emitting device 1 taken along line in FIG. 2. FIG. 4 is a perspective view explaining the internal structure of the light emitting device 1 shown in the state in which the light shielding member 90 is removed. FIG. 5 is a top view in the same state as in FIG. 4. FIG. 6 is a perspective view explaining the internal structure of the light emitting device 1 in the state in which the light transmissive member 82 and the wavelength conversion member 81 are further removed. FIG. 7 is a top view in the same state as in FIG. 6. FIG. 8 is a perspective view of an example optical part 80 according to the embodiment. FIG. 9 is a top view in the same state as in FIG. 8. FIG. 10 is a top view seen through the wavelength conversion member 81 to explain the bonding face between the light transmissive member 82 and the wavelength conversion member 81. In FIG. 10, the bonding regions in the metal film 821 of the light transmissive member 82 and the conducting layer 813 of the wavelength conversion member 81 are indicated with hatching lines. The region indicated by denser hatching lines represents the conducting layer 813. FIG. 11 is a bottom view of the wavelength conversion member 81 according to the embodiment. FIG. 12 is a top view of the light transmissive member 82.

A light emitting device 1 includes, as constituent elements, a base 10, a light emitting element 20, a submount 30, a light reflecting member 40, a protective device 50, a temperature measuring element 60, a wire 70, an optical part 80, and a light shielding member 90. The light emitting device 1 includes at least a light emitting element 20 and an optical part 80 as constituent elements.

The light emitting device 1 includes one or more light emitting elements 20. The light emitting device 1 includes the same number of submounts 30 and the light reflecting members 40 as that of the light emitting elements 20. It includes one or more protective devices 50. It includes one or more temperature measuring elements 60. It includes one or more wires 70.

An optical part 80 includes, as constituent elements, a wavelength conversion member 81 and a light transmissive member 82. The optical part 80 includes at least a wavelength conversion member 81 as a constituent element. The light emitting device 1 can include additional constituent elements.

Constituent elements will be explained next.

Base 10

A base 10 includes a recessed shape, recessed from the upper face to the lower face. In a top view, the outer shape is rectangular, and the recess is formed inward of the outer shape. The base 10 includes an upper face 11, a bottom face 12, a lower face 13, one or more inner lateral faces 14, and one or more outer lateral faces 15. In the top view, a frame is formed by the line(s) formed by the one or more inner lateral faces 14 meeting the upper face 11. The recess of the base 10 is surrounded by the frame.

The base 10 includes one or more stepped portions 16 inward of the frame. In the base 10, two stepped portions 16 having different heights from the bottom face 12 are formed. The stepped portions 16 consist only of an upper face and the lateral faces that extend in downward and meeting the upper face. The height of a stepped portion 16 is the height from the bottom face 12 to the upper face of the stepped portion 16. The one or more inner lateral faces 14 include the lateral face(s) meeting the upper face 11 of the base 10, and the lateral faces of the stepped portions 16.

Here, the one of the two stepped portions 16 having a smaller height from the bottom face 12 will be referred to as a first stepped portion 161 and the one having a larger height from the bottom face 12 will be referred to as a second stepped portion 162. The first stepped portion 161 is provided along the entire perimeter of the frame of the base 10. The second stepped portion 162 is provided along a portion of the frame without being along the entire perimeter of the frame of the base 10. In the base 10, a plurality of the second stepped portions 162 are formed.

The base 10 can be formed using a ceramic as a primary material. For example, aluminum nitride, silicon nitride, aluminum oxide, or silicon carbide can be used as a ceramic material. The material that can be used is not limited to ceramics, and any other material having insulating properties can be used as a primary material to form the base.

One or more metal films are disposed on the bottom face 12 of the base 10. One or more metal films are disposed on the upper faces of the second stepped portions 162. One or more metal films are disposed on the upper face 11 of the base 10. In the example light emitting device 1 illustrated in the drawings, four metal films are provided on the bottom face 12, one metal film is provided on each of the two stepped portions 162, and six metal films are provided on the upper face 11.

The one or more metal films disposed on the bottom face 12 include one that is electrically connected to the metal film disposed on the upper face 11. The one or more metal films disposed on the upper faces of the second stepped portions 162 include one that is electrically connected to at least one of the metal films disposed on the upper face 11.

Light Emitting Element 20

A light emitting element 20 is a semiconductor laser element. It does not have to be a semiconductor laser element. For example, light emitting elements, such as an LED or organic EL, can be employed as the light emitting element 20 of the light emitting device 1. In the light emitting device 1 exemplary shown in the drawings, a semiconductor laser element 20 is employed as a light emitting element 20.

Each semiconductor laser element 20 shown in the drawings includes a rectangular outline in the top view. The lateral face meeting one of the two short sides of the rectangle serves as the emission face through which the light exits the semiconductor laser element 20. The upper face and the lower face of the semiconductor laser element 20 have larger areas than the emission face.

The outgoing light (laser beam) from the semiconductor laser element 20 spreads, forming an elliptical far field pattern (hereinafter referred to as "FFP") in a plane parallel with the emission face. Here, FFP refers to the shape and light intensity distribution of the emitted light that is measured at a location distant from the emission face.

The shape of the FFP of the light emitted from a semiconductor laser element 20 is an ellipse having a longer diameter in the stacking direction of the semiconductor layers including the active layer than a diameter in the direction perpendicular to the stacking direction of the semiconductor layers (i.e., layer direction). In the FFP, the layer direction will be referred to as the lateral direction of the FFP, and the direction parallel with the stacking direction will be referred to as the vertical direction of the FFP.

Furthermore, the light having an intensity of at least $1/e^2$ relative to the peak intensity value based on the light intensity distribution of an FFP of a semiconductor laser element 20 will be referred to as the main portion of the emitted light. The angle corresponding to the full width at half maximum of the light intensity distribution will be referred to as divergence angle. The divergence angle in the vertical direction of an FFP will be referred to as vertical divergence angle, and the divergence angle in the horizontal direction of an FFP will be referred to as horizontal divergence angle.

For a semiconductor laser element 20, one emitting light having a peak emission wavelength in the range of 320 nm to 530 nm, typically in the range of 430 nm to 480 nm, can be employed. Examples of such a semiconductor laser element 20 include semiconductor laser elements including a nitride semiconductor. For nitride semiconductors, for example, GaN, InGaN, and AlGaN can be used. The light emitted by a light emitting element 20 is not limited to this.

Submount 30

A submount 30 is shaped as a rectangular cuboid having a lower face, an upper face, and lateral faces. The thickness of the submount 30 in the up-down direction is smallest. The shape is not limited to a rectangular cuboid. The submount 30 is formed with, for example, silicon nitride, aluminum nitride, or silicon carbide. Other materials can be used. A metal film is formed on the upper face of the submount 30.

Light Reflecting Member 40

A light reflecting member 40 includes two light reflecting faces 41 to reflect light. For a reflecting face, for example, a surface having a reflectance of at least 90% relative to the peak wavelength of the irradiated light is provided. The reflectance here can be set to 100% or less, or less than 100%.

The two light reflecting faces 41 are flat, and oblique to the lower face. The two light reflecting faces 41 have different oblique angles relative to the lower face from one another. In other words, neither of the two light reflecting faces 41 is orthogonal to or parallel with the lower face. The two light reflecting faces 41 are contiguous, forming one integral reflecting region.

Here, the light reflecting face closer to the lower face will be referred to as the first reflecting face 411, and the light reflecting face farther to the lower face will be referred to as the second reflecting face 412. In a light reflecting member 40, the oblique angle of the second reflecting face 412 is larger than the oblique angle of the first reflecting face 411. For example, the oblique angle difference between the first reflecting face 411 and the second reflecting face 412 is in the range of 10 to 60 degrees.

The light reflecting member can have three or more light reflecting faces 41 that form an integral reflection region. Alternatively, one light reflecting face 41 can form a reflecting region. The light reflecting member can have an additional light reflecting face that is not contiguous with the other light reflecting faces. The light reflecting faces 41 can be curved faces instead of flat faces.

Glass, metal or the like can be used as a primary material to form the outer shape of a light reflecting member 40. A heat resistant material is preferably used as the primary material. For example, glass such as quartz or BK7 (borosilicate glass), metals such as aluminum, or Si can be used as the primary material. The light reflecting faces can be formed, for example, by using a metal, such as Ag, Al, or the like, or a multilayer dielectric film, such as $Ta_2O_5/SiO_2$, $TiO_2/SiO_2$, $Nb_2O_5/SiO_2$ or the like.

Protective Device 50

A protective device 50 is provided to prevent overcurrent from damaging a certain element such as a light emitting element. For example, a Zener diode formed with Si can be used as the protective device 50.

Temperature Measuring Element 60

A temperature measuring element 60 is an element utilized as a temperature sensor for measuring the surrounding temperature. For example, a thermistor can be used as the temperature measuring element 60.

Wire 70

A wire 70 is used to electrically connect two constituent elements. A metal wire, for example, can be used as a wire 70.

Wavelength Conversion Member 81

A wavelength conversion member 81 includes a lower face, an upper face, and lateral faces. The wavelength conversion member 81 includes a wavelength conversion part 811. The wavelength conversion member 81 includes an enclosing part 812. The wavelength conversion member 81 includes a conducting layer 813. The wavelength conversion member 81 includes a metal film 814.

The wavelength conversion member 81 is formed by disposing a conducting layer 813, a metal film 814, or another film on a base. In other words, the wavelength conversion member 81 is formed by a process of providing a base for the wavelength conversion member 81 through forming or purchase, a process of disposing a conducting layer 813 on the base of the wavelength conversion member 81, and a process of disposing a metal film 814 on the base of the wavelength conversion member 81.

The process of forming a metal film 814 can be performed before the process of disposing a conducting layer 813. Alternatively, the wavelength conversion member 81 can be provided through purchase of a base with a metal film in the state in which a metal layer 813 is already disposed on the base of the wavelength conversion member 81.

The base is a rectangular cuboid-shaped plate. The shape is not limited to a rectangular cuboid. The wavelength conversion part 811 is included in the base of the wavelength conversion member 81. The enclosing part 812 is included in the base of the wavelength conversion member 81. The base of the wavelength conversion member 81 as a primary material can be made of an inorganic material insusceptible to degradation by irradiated light. The material for use as the base is not limited to an inorganic material.

In the wavelength conversion member 81, the wavelength conversion part 811 and the enclosing part 812 are integrally formed. The enclosing part 812 surrounds the wavelength conversion part 811. The inner lateral faces of the enclosing part 812 are in contact with the lateral faces of the wavelength conversion part 811, and the outer lateral faces of the enclosing part 812 are the lateral faces of the wavelength conversion member 81. The wavelength conversion member 81 is formed as an integral sintered body resulting from integrally sintering the wavelength conversion part 811 and the enclosing part 812.

Such an integral sintered body as the base of the wavelength conversion member 81 can be formed, for example, by integrally forming and sintering the wavelength conversion part 811, which is a formed part made of a sintered body or the like, and a powder material for forming the enclosing part 812. Alternatively, the base of the wavelength conversion member 81 can be formed by integrally forming and sintering the enclosing part 812, which is a formed part made of a sintered body or the like, and a powder material for forming the wavelength conversion part 811. For sintering, for example, spark plasma sintering (SPS), hot press sintering (HP) or the like can be used.

The wavelength conversion part 811 has a shape of a rectangular cuboid. The shape of the wavelength conversion part 811 is not limited to a rectangular cuboid. The wavelength conversion part 811 is a member that converts the incident light into light having a different wavelength. The wavelength conversion part 811 externally releases the wavelength-converted light. The wavelength conversion part 811 externally releases at least a portion of the light that entered the wavelength conversion part 811.

The wavelength conversion part 811 can be formed by using a ceramic as a primary material and a phosphor contained therein. It is not limited to this, and glass can be used as a primary material. The wavelength conversion part 811 can alternatively be formed using a polycrystal or single crystal phosphor. It is preferable to use a material having a melting point of 1300° C. to 2500° C. as a primary material for the wavelength conversion part 811. This can make the wavelength conversion part 811 insusceptible to deformation or discoloring even when the heat is applied to the wavelength conversion part 811.

For example, in the case of employing a ceramic as a primary material for the wavelength conversion part 811, the wavelength conversion part 811 can be formed by sintering a phosphor and a light transmissive material such as aluminum oxide. The phosphor content can be set to 0.05 volume percent to 50 volume percent relative to the total volume of the ceramic. Alternatively, for example, a ceramic that is made by sintering phosphor powder and contains substantially only phosphor can be used.

Examples of phosphors include yttrium aluminum garnet (YAG) activated by cerium, lutetium aluminum garnet (LAG) activated by cerium, nitrogen-containing calcium aluminosilicate ($CaO—Al_2O_3—SiO_2$) activated by europium and/or chromium, silicate ($(Sr,Ba)_2SiO_4$) activated by europium, α-SiAlON phosphors, and β-SiAlON phosphors. Among these examples, a YAG phosphor that is highly heat resistant, and capable of emitting white light when combined with blue excitation light is preferably used.

The enclosing part 812 has a shape of a rectangular cuboid having a through hole in the central portion. The wavelength conversion part 811 is provided in the through hole. The shape of the through hole corresponds to the shape of the wavelength conversion part 811, and the enclosing part 812 surrounds the lateral faces of the wavelength conversion part 811.

The enclosing part 812 can be formed by using a ceramic as a primary material. The material forming the enclosing part 82 is not limited to this, and for example, a metal, ceramic metal composite, or the like can be used. The enclosing part 82 is preferably formed of a high thermal conductivity material to dissipate the heat generated by the wavelength conversion part 811. The enclosing part 812 formed of a high thermal conductivity material as a primary material has a heat dissipation function to dissipate the heat generated by the wavelength conversion part 811. From this perspective, the enclosing part 812 can be considered as a heat dissipating member.

It is preferable to employ for the enclosing part 812 a high reflectance material that reflects the light from the semiconductor laser element 20 and the light emitted from the phosphor. The light is preferably reflected at least by the regions of the enclosing part that surround the lateral faces of the wavelength conversion part 811. The enclosing part 812 formed of a high reflectance material as a primary material is highly reflective, and can be considered as a light reflecting member from this perspective. Examples of high reflectance and high thermal conductivity materials include alumina ($Al_2O_3$).

The enclosing part 812 does not have any wavelength conversion function such as that possessed by the wavelength conversion part 811. The enclosing part 812 cannot perform a whole function of converting a wavelength of the incident light into light having a different wavelength and outputting the light outside. In other words, the enclosing part 812 cannot perform at least one of the functions of wavelength conversion of the incident light on the enclosing part 812 into light having a different wavelength, or external release of the incident light. The enclosing part 812 cannot perform at least one of conversion or external release of the incident light. For example, the enclosing part 812 does not contain any phosphor. The enclosing part 812 has light shielding properties, i.e., it has a transmittance of 5% at most.

The conducting layer 813 is disposed on or above the upper face or on or below the lower face of the wavelength conversion member 81. The conducting layer 813 is disposed on the upper face or the lower face of the base of the wavelength conversion member 81. Another thin film (e.g., anti-reflection film) can be interposed between the base and the conducting layer. The conducting layer 813 is disposed on the outside of a predetermined region to surround the predetermined region of the wavelength conversion member 81. The predetermined region is, for example, the region in the wavelength conversion member 81 where the main portion of the light is incident. Providing the conducting layer 813 on the outside of the region where the main portion of the light is incident can improve the light extraction efficiency.

The conducting layer 813 is disposed on the enclosing part 812. The conducting layer 813 is disposed outside of the wavelength conversion part 811. The conducting layer 813 is located close to the wavelength conversion part 811. For example, the distance between the wavelength conversion part 811 and the conducting layer 813 at the closest position is 500 μm at most, preferably 300 μm at most. The conducting layer 813 is disposed to surround the wavelength conversion part 811. In the wavelength conversion member 81 shown in the drawings, a line-shaped conducting layer 813 surrounds the wavelength conversion part 811.

The conducting layer 813 preferably surrounds the wavelength conversion part 811 in the form of a fine line. A fine line, for example, refers to a shape in which the line width is smaller than the width of the wavelength conversion part 811, and the line length is larger than the perimeter of the wavelength conversion part 811 in a bottom view. For example, the line width can be set to one half of the width of the wavelength conversion part 811 at most. The width of the wavelength conversion part 811 here is the length of a short side in the case of a rectangular outline, and the length of the short diameter in the case of an elliptical outline. For any other shape, the width can be identified based on these examples.

The conducting layer 813 can be formed by using an oxide. Examples of oxides for forming the conducting layer 813 include ruthenium oxide ($RuO_2$). Oxides such as ruthenium oxide are more fragile and easily breakable as compared to metals such as gold, silver, aluminum, and the like.

The conducting layer 813 is not transparent, and is a colored film. The conducting layer 813 has light shielding properties. Having light shielding properties means that the transmittance of the material relative to visible light is 60% at most. The conducting layer 813 has visible light absorbing properties. The conducting layer 813 formed of ruthenium oxide is black colored, and thus absorbs light and has light shielding properties.

Oxides that can be used as the conducting layer include, in addition to ruthenium oxide, indium tin oxide (ITO). Ruthenium oxide is superior to indium tin oxide in terms of resistivity change relative to temperatures or humidity. This will be explained with reference to FIG. 13 to FIG. 15.

Figure 13:
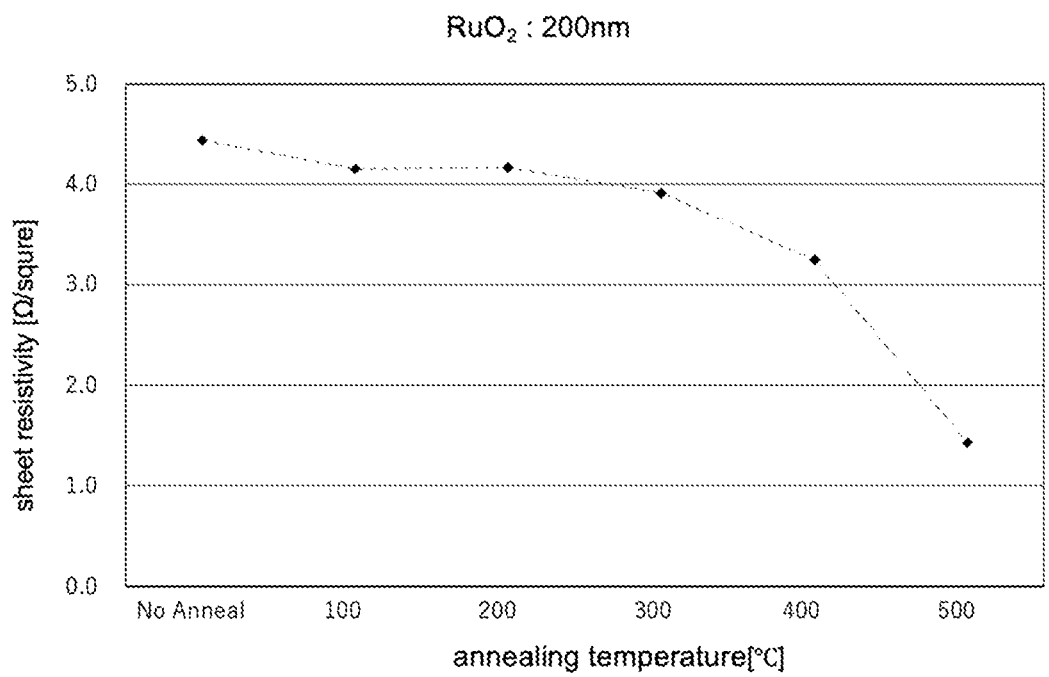
FIG. 13 is a graph showing the results of the experiment conducted to investigate the correlation between annealing temperature and sheet resistivity.

FIG. 13 shows the results of the experiment conducted to measure the sheet resistivity (ohms per square) of ruthenium oxide treated at various annealing temperatures (° C.). In this experiment, ruthenium oxide of 200 nm in thickness was formed by sputtering and subjected to annealing for one hour under atmospheric conditions. The sheet resistivity was measured using a surface resistivity meter, Loresta-GP (manufactured by Mitsubishi Chemical Corporation) after bringing the film back to room temperature (about 25° C.). The annealing temperatures were varied from 100° C. to 500° C. in increments of 100° C., and the sheet resistivity was measured for each temperature.

It is understood from the results shown in FIG. 13 that the sheet resistivity of ruthenium oxide changes in correspondence with the temperature applied thereto. It is also understood that the sheet resistivity declines as the heat treating temperature increases. Furthermore, it is also understood that the amount of change in the sheet resistivity relative to temperature is grater in the range of 300° C. to 500° C. than in the range of 100° C. to 300° C.

Figure 14:
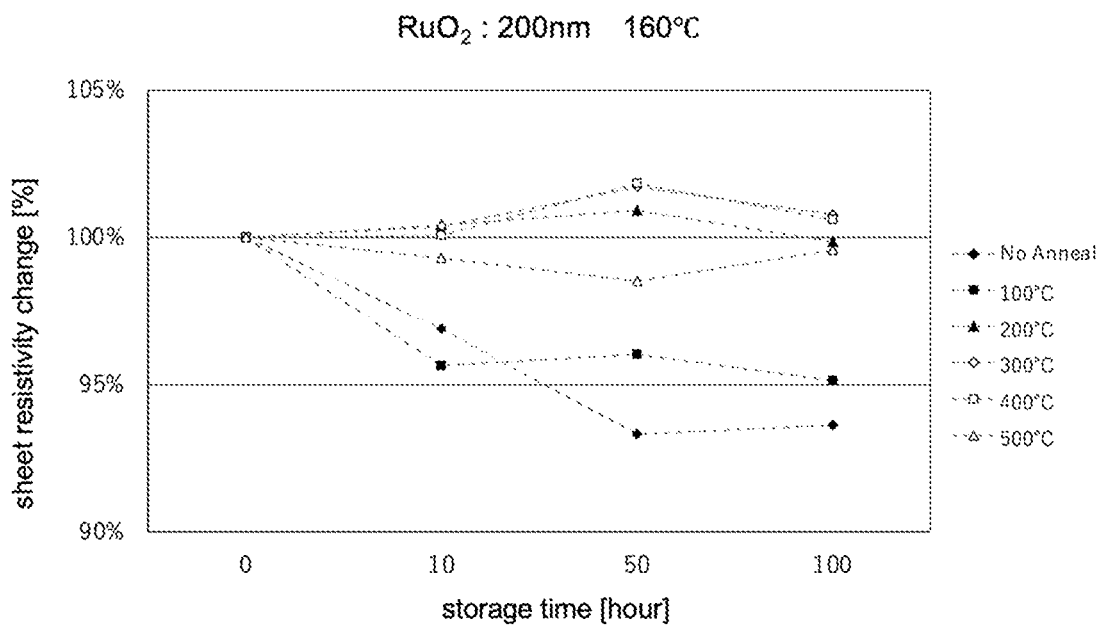
FIG. 14 is a graph showing the results of the experiment conducted to investigate changes in the resistivity of the ruthenium oxides that were heat treated under different conditions and one that was not heat treated, stored under high temperature condition.

FIG. 14 shows the results of the experiment conducted to investigate the sheet resistivity (ohms per square) change (%) relative to storage time (hours) when each ruthenium oxide measured with reference to FIG. 13 was stored after changing the storage environment from room temperature to 160° C. In this experiment, the sheet resistivity values were measured after storing for 0, 10, 50, and 100 hours, and the changes from the sheet resistivity at 0 hours were calculated. The same meter as that used with reference to FIG. 13 was used.

It is understood from the results shown in FIG. 14 that the sheet resistivity changed in the ruthenium oxide subjected to no heat treatment and the ruthenium oxide subjected to heat treatment at 100° C. Furthermore, it was observed that the sheet resistivity tended to decline with the passage of storage time, but hardly changed past a certain time. On the other hand, it is understood that the sheet resistivity remained substantially constant regardless of storage time for the ruthenium oxide samples heat-treated at 200° C. or higher.

It is understood from the results that the sheet resistivity of the ruthenium oxide heat-treated at a higher temperature than the temperature it would be subjected to when in use remained substantially constant even when it was stored at the in-use temperature for a long time. Furthermore, it is understood that the sheet resistivity of the ruthenium oxide not heat-treated or heat-treated at a lower temperature than the temperature to which it would be subjected when in use changed when stored at the temperature for a long time.

Accordingly, considering the environment in which the conducting layer 813 formed of ruthenium oxide will be used, the conducting layer 813 heat treated at a higher temperature than the temperature to which it will be subjected when in use has better resistivity change characteristics relative to heat in the environment it will be used.

Whether to perform a heat treatment or not, and the temperature at which the heat treatment is performed, can be suitably determined in accordance with the environment in which the conducting layer 813 will be used. It is fair to say that it would be fine to perform a heat treatment on the conducting layer 813 at a temperature exceeding the maximum temperature of the expected temperature range under which the conducting layer will be used.

In the case of performing a heat treatment, the process of disposing a conducting layer 813 on the base of the wavelength conversion member 81 would include a process of forming a conducting layer 813 on the base of the wavelength conversion member 81 and a process of performing a heat treatment on the formed conducting layer 813. In the process of forming a conducting layer 813, for example, sputtering can be used to form a conducting layer 813. In the process of performing a heat treatment on the conducting layer 813, for example, an annealing treatment can be used.

In the process of forming a conducting layer 813, for example, a conducting layer 813 having a thickness of 100 nm to 400 nm is formed. In the process of performing a heat treatment on the conducting layer 813, for example, ruthenium oxide heart treated at 100° C. or a higher temperature can be employed, considering the environment in which the wavelength conversion member 81 in the light emitting device 1 illustrated in the drawings will be used. Furthermore, a ruthenium oxide heat-treated at 300° C. or a lower temperature can be employed.

A preferable example of the conducting layer 813 has a sheet resistivity change of less than 3% when stored for 50 or 100 hours after changing the storage environment from room temperature to 100° C. Another preferable example of the conducting layer 813 has a sheet resistivity change of less than 2% when stored for 50 or 100 hours at 100° C. Another preferable example of the conducting layer 813 has a sheet resistivity change of less than 3% when stored for 50 or 100 hours at 200° C. Another preferable example of the conducting layer 813 has a sheet resistivity change of less than 2% when stored for 50 or 100 hours at 200° C.

Figure 15:
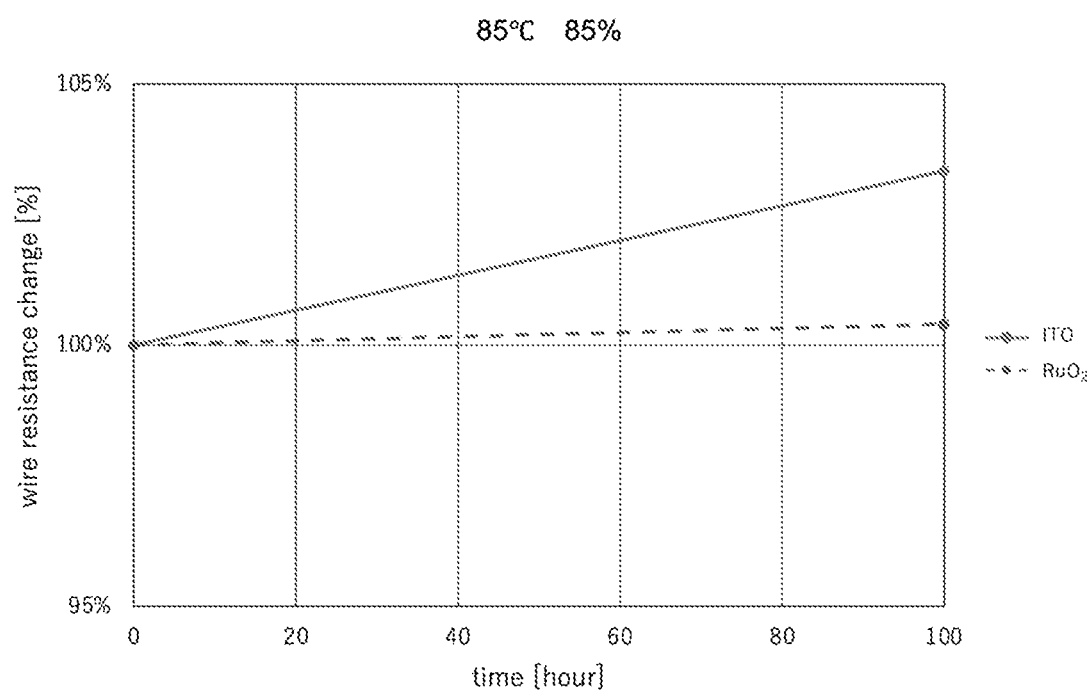
FIG. 15 is a graph showing the results of the experiment conducted to investigate changes in the resistivity of ruthenium oxide and indium tin oxide stored under high temperature and high humidity conditions.

FIG. 15 shows the results of the experiment conducted to investigate the wire resistance ($\Omega$) change (%) in the ruthenium oxide and indium tin oxide samples relative to storage time (hours) after changing the storage environment from room temperature to high temperature and high humidity. As the high temperature and high humidity environment, an 85° C. temperature and 85% humidity environment was used. The wire resistance values at zero and 100 storage hours were measured to calculate the changes from the wire resistance at zero hours.

In this experiment, ruthenium oxide and indium tin oxide samples having the same shape (width, thickness, and length) were used. Specifically, those prepared as the line-shaped conducting layer 813 shown in FIG. 11 having a width of 200 μm and a film thickness of 100 μm were used.

The ruthenium oxide and indium tin oxide wires were prepared ten pieces each. FIG. 15 shows the average resistance change values of ten pieces of samples for each group.

In this experiment, moreover, ruthenium oxide samples annealed at 300° C. and indium tin oxide samples annealed at 500° C. were used. The annealing treatment applied to the indium tin oxide is a treatment for achieving light transmissivity, which is one of the characteristics of a conducting layer formed with indium tin oxide.

As shown in FIG. 15, almost no resistance change was observed in the ruthenium oxide samples, but resistance changes of several percentages were observed in the indium tin oxide samples. Specifically, the resistance changes found in the ten ruthenium oxide samples in the range of 0.2% to 0.5%, whereas the resistance changes found in the ten indium tin oxide test pieces in the range of 2.6% to 3.8%.

The resistivity is still being measured past 100 hours, and the resistance of the indium tin oxide samples has steadily increased past 100 hours, and is still increasing even at more than 400 hours later.

It can be said based on the results that indium tin oxide is a material whose wire resistance changes more easily than ruthenium oxide when the storage environment changes from room temperature to high temperature and high humidity. The results also show that ruthenium oxide can form a conducting layer superior in terms of resistance change relative to temperature or humidity to a conducting layer formed of indium tin oxide having the same shape.

One preferable example of the conducting layer 813 has a wire resistance change of 2.5% at most when stored for 100 hours after changing the storage environment from room temperature to high temperature and high humidity of 85° C. temperature and 85% humidity. Another preferable example of the conducting layer 813 has a wire resistance change of 1.5% at most when stored for 100 hours after changing the storage environment from room temperature to high temperature and high humidity of 85° C. temperature and 85% humidity. Another preferable example of the conducting layer 813 has a wire resistance change of 0.5% at most when stored for 100 hours after changing the storage environment from room temperature to high temperature and high humidity of 85° C. temperature and 85% humidity.

In the wavelength conversion member 81, a plurality of metal films 814 are on the face on or the face closer to which the conducting layer 813 is disposed. The metal films 814 are disposed on the enclosing part 812 and on the outside of the wavelength conversion part 811. In the metal films 814 disposed, two of the metal films 814 are respectively connected to the conducting layer 813. These two metal films 814 are not connected with one another.

In a plan view, viewed from the face on which the conducting layer 813 is disposed, one end of the line-shaped conducting layer 813 at least partially overlaps with one of the two metal films 814 and the other end of the conducting layer 813 at least partially overlaps with the other one of the two metal films 814. The metal film 814 can be formed by using, for example, Ti/Pt/Au.

Light Transmissive Member 82

A light transmissive member 82 has a lower face, an upper face, and lateral faces. The light transmissive member 82 has light transmitting properties to allow light to pass through. Light transmitting properties here mean a light transmittance of at least 80%. The light transmissive member 82 includes a base that is a rectangular cuboid-shaped plate. The shape is not limited to a rectangular cuboid.

The base of the light transmissive member 82 can be formed by using sapphire as a primary material. Sapphire is a material having a relatively high transmittance and relatively high mechanical strength. As example primary materials, quartz, silicon carbide, glass or the like can be used in addition to sapphire.

The light transmissive member 82 includes a plurality of metal films 821. The metal films 821 are disposed on or above the upper face of the light transmissive member 82. The metal films 821 includes two of the metal films 821 provided for wiring purposes. These two metal films 821 are disposed in the outer peripheral region of the light transmissive member 82, and not disposed in the central region of the light transmissive member 82.

Each of the two metal films 821 partially have a bonding region. The metal films 821 can be provide with Ti/Pt/Au, for example. The metal films 821 can further be provided with, for example, AuSn disposed in the bonding regions of the metal films 821.

Light Shielding Member 90

A light shielding member 90 is formed by using a resin having light shielding properties. Light shielding properties here mean the property of not transmitting light, but light shielding properties may be achieved by utilizing light blocking, absorbing, or reflecting properties. For example, it can be formed by allowing a resin to contain fillers, such as a light diffusing material and/or light absorbing material.

Examples of resins used to form the light shielding member 90 include epoxy resins, silicone resins, acrylate resins, urethane resins, phenol resins, BT resin, and the like. Examples of light absorbing fillers include dark pigments such as carbon black and the like.

Light Emitting Device 1

A light emitting device 1 manufactured by using these constituent elements will be explained next.

First, two light reflecting members 40 are disposed on the bottom face 12 of the base 10. The two light reflecting members 40 are disposed on the metal film disposed at different locations, and the lower faces of the two light reflecting members 40 are bonded to the bottom face 12 of the base 10. The two light reflecting members 40 are arranged to have point symmetry about a point SP (see FIG. 7). Moreover, the two light reflecting members 40 are positioned such that the upper edges of the light reflecting faces 41 are in parallel with or orthogonal to the inner lateral faces 14 or the outer lateral faces 15 of the base 10 when viewed from the top.

Next, a protective device 50 and a temperature measuring element 60 are disposed on the bottom face 12. The protective device 50 is disposed on and bonded to the metal film on which one of the two light reflecting members 40 is disposed. The temperature measuring element 60 is disposed on and bonded to the metal film that is different from those on which the two light reflecting members 40 are disposed.

Subsequently, two submounts 30 are disposed on the bottom face 12 of the base 10. The two submounts 30 are disposed on different metal films from one another, and the lower faces of the two submounts 30 are bonded to the bottom face 12 of the base 10. The two submounts 30 are disposed on the metal films on which the light reflecting members 40 are respectively disposed. The submounts 30 and the light reflecting members 40 can be disposed on different metal films from one another.

Then light emitting elements 20 are disposed on the submounts 30. In the light emitting device 1 illustrated in the drawings, semiconductor laser elements 20 are disposed on the submounts 30. The two semiconductor laser elements 20 are respectively mounted on the upper faces of the different submounts 30, bonding their lower faces thereto. The two semiconductor laser elements 20 are arranged to have point symmetry about the point SP. In other words, the point about which the two semiconductor laser elements 20 are symmetrical coincides with the point about which the two light reflecting members 40 are symmetrical. In the explanation below, the point SP will be referred to as the point of symmetry.

The emission faces of the two semiconductor laser elements 20 are not in parallel with or orthogonal to the inner lateral faces or the outer lateral faces of the base 10 in the top view. Accordingly, the emission faces of the two semiconductor laser elements 20 are not in parallel with or orthogonal to the upper edges of the light reflecting faces 41. In other words, the semiconductor laser elements 20 are disposed such that the emission faces are oblique to the inner lateral faces 14 and the outer lateral faces 15 of the base 10, or the upper edges of the light reflecting faces 41, in the top view.

Instead of disposing the semiconductor laser elements 20 obliquely, the light reflecting members 40 can be obliquely disposed. In other words, the semiconductor laser elements 20 can be disposed in parallel with or orthogonal to the inner lateral faces 14 or the outer lateral faces 15 of the base 10 while disposing the light reflecting members 40 not in parallel with or orthogonal the inner lateral faces 14 or the outer lateral faces 15 of the base 10.

The light emitted from each of the emission faces of the two semiconductor laser elements 20 hits the corresponding light reflecting member 40. The corresponding light reflecting member 40 means the one that corresponds to the semiconductor laser elements 20 disposed on the same metal film. Each semiconductor laser element 20 is arranged such that at least the main portion of the emitted light is irradiated on the light reflecting faces 41.

Between the semiconductor laser element 20 and the corresponding light reflecting member 40, the semiconductor laser element 20 is located more distant from the point of symmetry than the light reflecting member 40. Accordingly, the light emitted from the semiconductor laser elements 20 will travel in the direction towards the point of symmetry. Furthermore, at least one of the two light emitting elements 20 is arranged closely to the temperature measuring element 60. In this manner, the temperature of the light emitting element 20 can be measured adequately.

The submounts 30 equipped with the semiconductor laser elements 20 play the role as heat dissipating members to dissipate the heat generated by the semiconductor laser elements 20 in the light emitting device 1. The submounts 30 can simply be formed with a material having a higher thermal conductivity than the semiconductor laser elements 20 in order to allow them to function as heat dissipating members. Forming the submounts with a material having a higher thermal conductivity than the bottom face of the base allows them to achieve a higher heat dissipating effect.

The submounts 30 can play the role of adjusting the positions of the light emitted by the semiconductor laser elements 20 in the light emitting device 1. For example, in the case of making the light traveling along the optical axis in parallel with the bottom face 12 and irradiating a predetermined position of a light reflecting face 41, the submount can be used as an adjusting member.

Subsequently, a plurality of wires 70 (first wires 71) for electrical connection of the light emitting elements 20, the protective device 50, and the temperature measuring element 60 are bonded. For electrical connection, the metal films disposed on the bottom face 12 of the base 10 are utilized. In this manner, these elements and an external power supply can be electrically connected via the metal films on the upper face 11 of the base 10.

Subsequently, an optical part 80 is disposed. For the light emitting device 1 illustrated in the drawings, an optical part 80 in which a wavelength conversion member 81 and a light transmissive member 82 are joined is prepared beforehand. The optical part 80 shown in the drawings is formed by the process of joining the wavelength conversion member 81 and the light transmissive member 82 so as to electrically connect the metal film 814 of the wavelength conversion member 81 and the metal film 821 of the light transmissive member 82.

The optical part 80 is disposed on the upper face of the base 10. The lower face of the optical part 80 is joined to the base 10. The optical part 80 is joined to the upper faces of the stepped portions 16 of the base 10. The optical part 80 is joined to the upper face of the first steeped portion 161. The light transmissive member 82 of the optical part 80 is joined to the base 10.

Joining the optical part 80 to the base 10 creates a closed space in which the semiconductor laser elements 20 are disposed. In this manner, in the light emitting device 1, the optical part 80 can play the role as a cover member. Moreover, the closed space is formed as a hermetically sealed space. Hermetically sealing the space can suppress dust, such as organic substances, from collecting on the emission faces of the semiconductor laser elements 20.

The main portion of the light from the light emitting elements 20 enters the optical part 80. The light from the light emitting elements 20 enters the wavelength conversion member 81 of the optical part 80. The light from the light emitting elements 20 enters the wavelength conversion part 811 of the wavelength conversion member 81. The light from the light emitting elements 20 transmits through the light transmissive member 82 of the optical part 80. The light that has passed through the light transmissive member 82 enters the wavelength conversion part 811.

In the lower face of the wavelength conversion member 81 includes a light incident region where the main portion of light enters, and the surrounding region. In the wavelength conversion member 81, the face that includes the light incident region can be considered as the light incident face from which the light from the light emitting elements 20 enters.

In the wavelength conversion member 81, the wavelength conversion part 811 is the light incident region, and the enclosing part 812 is the surrounding region. The example is not limited to one in which the surrounding region is the enclosing part 812. For example, the size of the wavelength conversion part 811 can be increased to include both the light incident region and the surrounding region in the lower face of the wavelength conversion part 811. In the case of a wavelength conversion member without an enclosing part 812 that surrounds the lateral faces of the wavelength conversion part 811, for example, the lower face of the wavelength conversion part 811 includes both the light incident region and the surrounding region.

The light that has entered the wavelength conversion part 811 in part or whole is converted by the wavelength conversion part 811 into light having a different wavelength. The light from the light emitting elements 20 or the wavelength-converted light is externally released from the light emitting device 1 through the upper face of the wavelength conversion part 811. In other words, the upper face of the wavelength conversion part 811 serves as the light extraction face of the light emitting device 1.

The conversion efficiency of the wavelength conversion part 811 can be readily reduced if the heat generated during wavelength conversion is concentrated in a certain location. Thus, it is suitable for the light entering the wavelength conversion part 811 to be dispersed. This can be achieved, for example, by not allowing the high intensity portions of the laser beams from the two semiconductor laser elements 20 to overlap. For example, such a control can be made possible by adjusting the light reflecting faces 41 of the light reflecting members 40.

In the optical part 80, the light transmissive member 82 and the wavelength conversion member 81 are joined together. The wavelength conversion member 81 is joined to the upper face of the light transmissive member 82. The enclosing part 812 of the wavelength conversion member 81 and the light transmissive member 82 are joined together. The metal film 814 of the wavelength conversion member 81 and the metal film 821 of the light transmissive member 82 are bonded. The bonding region of the metal film 821 of the light transmissive member 82 is bonded to the metal film 814 of the wavelength conversion member 81.

The conducting layer 813 surrounds the wavelength conversion part 811 in the vicinity thereof in the form of a fine line-shaped film. If an anomaly such as a crack occurs in the wavelength conversion part 811, the shock would also produce a crack in the conducting layer 813, thereby changing the state of the electrical connection. By detecting a considerable rise in the resistance value, an anomaly in the wavelength conversion part 811 can be detected.

The conducting layer 813 thus can be considered as an anomaly detection element, a sensor that detects an anomaly in the wavelength conversion part 811. The wavelength conversion part 811 can be considered as a member subject to anomaly detection by the anomaly detection element. Similarly, the light incident region can be considered as a region subject to detection.

Employing a conducting layer 813 formed of an oxide that is more fragile and easily breakable as compared to metal materials can increase the accuracy in detecting a damage of the wavelength conversion part.

In the wavelength conversion member 81, the conducting layer 813 is disposed on the light incident face side where the light from the light emitting elements 20 enters. The conducting layer 813 is disposed on the side that faces the light transmissive member 82 in the wavelength conversion member 81. Accordingly, the light transmissive member 82 is disposed in the vicinity of the conducting layer 813 without being in contact with the conducting layer 813. Alternatively, the light transmissive member 82 is disposed in contact with the conducting layer 813.

Because the temperature of the conducting layer 813 increases as the temperature of the wavelength conversion part 811 increases, high output light entering the wavelength conversion part 811 increases the resistance of the conducting layer 813 to raise the resistance value measured. A large resistance change attributable to heat can cause an anomaly detection malfunction. As shown in the test results in FIG. 13 to FIG. 15, the conducing layer 813 formed with ruthenium oxide can reduce such malfunctions.

Furthermore, because the conducting layer 813 is disposed in a narrow space between the base of the wavelength conversion member 81 and the light transmissive member 82, the temperature of the conducting layer 813 is considered to change according to the temperature of the wavelength conversion part 811. Considering such an environment in which the conducting layer 813 is used, it is preferable to dispose a heat-treated conducting layer 813 in the wavelength conversion member 81.

Between two conducing layers with the same size and shape, one having a lower sheet resistivity has a lower wire resistance. When used in anomaly detection, an excessively low wire resistance can result in a small resistance change to affect the detection accuracy. Considering this point, in the light emitting device 1 shown in the drawings, it is preferable to employ a conducting layer 813 formed of ruthenium oxide annealed at a temperature ranging from 100° C. to 300° C., for example. It is more preferable to employ a conducting layer 813 formed of ruthenium oxide annealed at a temperature ranging from 150° C. to 300° C., for example.

The conducting layer 813 is not disposed directly under the light incident region. The metal film 821 of the light transmissive member 82 is not disposed directly under the light incident region. This allows the light to enter the wavelength conversion part 811 without being blocked by the colored conducting layer 813.

The bonding regions of the metal film 821 of the light transmissive member 82 are positioned in the regions where the metal film 814 of the wavelength conversion member 81 are disposed. The metal film 821 of the light transmissive member 82 is not disposed directly under the conducting layer 813. Accordingly, disposing the conducting layer 813 having light shielding properties can block the light being incident on the outside of the wavelength conversion part 811. The conducting layer 813 has a transmittance of 60% at most relative to the emitted light from the light emitting elements 20.

The upper face of the light transmissive member 82 is larger than the lower face of the wavelength conversion member 81. In the top view, the upper face of the light transmissive member 82 surrounds the lower face of the wavelength conversion member 81, or surrounds the wavelength conversion member 81. In the top view, the two metal films 821 provided on the upper face of the light transmissive member 82 are each disposed to straddle a region overlapping and a region not overlapping with the lower face of the wavelength conversion member 81.

Subsequently, wires 70 (second wires 72) for electrically connecting the anomaly detection element is bonded. For the electrical connection, the metal film disposed on the second stepped portions 162 of the base 10 and the metal film of the optical part 80 are utilized. One end of the second wire 72 is bonded to the metal film 821 on the upper face of the light transmissive member 82 and at the other end is bonded to the metal film on the upper faces of the second stepped portions 162. This can electrically connect the anomaly detection element and an external power supply via the metal film on the upper face 11 of the base 10.

Subsequently, a light shielding member 90 is provided inward of the frame formed by the upper face 11 of the base 10. The light shielding member 90 is formed to fill the gap between the base 10 and the wavelength conversion member 81. The light shielding member 90 can be formed, for example, by allowing a thermosetting resin to flow in and be hardened by heating. Disposing a light shielding member 90 can reduce leakage of light from areas other than the light extraction face.

The light shielding member 90 is in contact with the inner lateral faces 14 meeting the upper face 11 of the base 10, the upper faces of the stepped portions 16 of the base 10, the lateral faces of the light transmissive member 82, the upper face of the light transmissive member 82, and the lateral faces of the wavelength conversion member 81. It does not reach the upper face of the wavelength conversion member 81. Even if the light shielding member 90 reaches the upper face of the enclosing part 812, it does not reach the upper face of the wavelength conversion part 811. In this manner, the light shielding member 90 can be disposed to fill the gap while avoiding the wavelength conversion part 811 that is the light extraction face.

In forming the light shielding member 90, the resin may penetrate into the gap between the light transmissive member 82 and the wavelength conversion member 81, but does not reach the lower face of the wavelength conversion part 811. The light shielding member 90 encloses the second wires 72. In other words, when the formation of the light shielding member 190 is completed, the second wires 72 are not exposed from the light emitting device 1. This can protect the second wires 72 from water droplets or the like. The light shielding member 90 does not necessarily enclose the second wires 72.

The light shielding member 90 in the top view hides the metal regions that were exposed at a region inward of the frame formed by the upper face 11 of the base 10. In the light emitting device 1, the light shielding member 90 formed with an insulating material plays the role as an insulation member. This allows the anomaly detection mechanism to operate properly. Also, the conduction region for supplying power from an external power supply to the light emitting device 1 can limit to the area on the outside of the recess of the base 10.

Certain embodiments of the present disclosure have been described. However, the present invention having the technical characteristics disclosed in the description is not limited to the configurations of the described embodiments. For example, the present invention is applicable to a light emitting device having a component not disclosed in any of the embodiments. As such, the mere fact that there is a difference from the disclosed structure would not provide any grounds for the inapplicability of the present invention.

The present invention is applicable to a device even if the device does not make it essential to necessarily and fully include all of the constituent elements disclosed by the embodiments. In the event that a certain component of a light emitting device included in any of the embodiments is not recited in the claim, the claimed invention may still be applicable in view of the design flexibility of a person of ordinary skill in the art for such a component through the use of an alternative, an omission, a shape change, a change in the materials employed, or the like, without limiting it to what is disclosed in the embodiment.

The light emitting devices and the optical parts disclosed in the embodiments can be utilized as the optical systems employed in light sources for vehicle headlights, lighting fixtures, projectors, head mounted displays and backlights for other displays.

What is claimed is:

1. A light emitting device comprising:
    a light emitting element; and
    a wavelength conversion member comprising:
        a wavelength conversion part configured to convert light emitted from the light emitting element into light having a different wavelength and to output the light having the different wavelength,
        an enclosing part enclosing the wavelength conversion part, and
        a conducting layer disposed on the enclosing part and surrounding the wavelength conversion part;
    wherein the conducting layer comprises ruthenium oxide annealed at a predetermined temperature.

2. The light emitting device according to claim 1, wherein:
    the enclosing part is configured not to perform at least one of:
        wavelength conversion of the light emitted from the light emitting element into light having a different wavelength, or
        external release of the light.

3. The light emitting device according to claim 1, wherein:
    the conducting layer is an anomaly detection element configure to detect whether an anomaly such as breakage occurs in the wavelength conversion part.

4. The light emitting device according to claim 1, wherein:
    the wavelength conversion part has a light incident face on which the light emitted from the light emitting element is incident; and
    the conducting layer is disposed on the light incident face side.

5. The light emitting device according to claim 1, wherein:
    the wavelength conversion member further comprises a metal film disposed outside the wavelength conversion part and electrically connected to the conducting layer.

6. The light emitting device according to claim 1, further comprising:
    a heat dissipating member connected to the wavelength conversion member;
    wherein the conducting layer is disposed on a side of the wavelength conversion member that faces the heat dissipating member.

7. The light emitting device according to claim 6, wherein:
    the conducting layer is not in contact with the heat dissipating member.

8. The light emitting device according to claim 1, wherein:
    the conducting layer has a wire resistance change of 2.5% at most when stored for 100 hours after changing a storage environment from room temperature to a temperature of 85° C. and a humidity of 85%.

9. The light emitting device according to claim 1, wherein:
    the conducting layer has a transmittance of 60% at most relative to the light emitted from the light emitting element, and has a wire resistance change of 2.5% at most when stored for 100 hours after changing a storage environment from room temperature to a temperature of 85° C. and a humidity of 85%.

10. The light emitting device according to claim 1, wherein:
    the conducting layer has a transmittance of 60% at most relative to the light emitted from the light emitting element, and has a wire resistance change of 2.5% at most when stored for 100 hours after changing a storage environment from room temperature to a temperature of 85° C. and a humidity of 85%.

11. The light emitting device according to claim 1, wherein:
    the conducting layer consists essentially of ruthenium oxide.

12. The light emitting device according to claim 1, wherein:
    the predetermined temperature is at least 150° C.

13. The light emitting device according to claim 1, wherein:

the predetermined temperature exceeds a maximum temperature of an expected temperature range under which the conducting layer will be used.

14. An optical part comprising:
a base having:
   a wavelength conversion part outputting light having a different wavelength from a wavelength of light incident on the base, and
   an enclosing part enclosing lateral faces of the wavelength conversion part; and
a conducting layer disposed on an upper face or a lower face of the enclosing part, and surrounding the wavelength conversion part,
wherein the conducting layer comprises ruthenium oxide annealed at a predetermined temperature.

15. The optical part according to claim 14, wherein:
the conducting layer has a sheet resistivity change of less than 3% when stored for 50 hours or 100 hours after changing a storage environment from room temperature to a temperature of 100° C.

16. The optical part according to claim 14, wherein:
the conducting layer has a transmittance of 60% at most relative to visible light and a sheet resistivity change of less than 3% when stored for 50 hours or 100 hours after changing a storage environment from room temperature to a temperature of 100° C.

17. The optical part according to claim 14, wherein:
the conducting layer consists essentially of ruthenium oxide.

18. The optical part according to claim 14, wherein:
the predetermined temperature is at least 150° C.

19. The optical part according to claim 14, wherein:
the predetermined temperature exceeds a maximum temperature of an expected temperature range under which the conducting layer will be used.

* * * * *